(12) United States Patent
Singh et al.

(10) Patent No.: US 11,799,504 B2
(45) Date of Patent: *Oct. 24, 2023

(54) BAND SWITCHING BALUN

(71) Applicant: Samsung Electronics Co., Ltd., Suwon-si (KR)

(72) Inventors: Amitoj Singh, Sunnyvale, CA (US); Ajaypat Jain, San Jose, CA (US); Xiaohua Yu, San Jose, CA (US); Tienyu Chang, Sunnyvale, CA (US); Siu-Chuang Ivan Lu, San Jose, CA (US); Sang Won Son, Palo Alto, CA (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

This patent is subject to a terminal disclaimer.

(21) Appl. No.: 17/585,480

(22) Filed: Jan. 26, 2022

(65) Prior Publication Data

US 2022/0149872 A1   May 12, 2022

Related U.S. Application Data

(63) Continuation of application No. 16/987,390, filed on Aug. 6, 2020, now Pat. No. 11,245,426.

(Continued)

(51) Int. Cl.
*H04L 23/02* (2006.01)
*H04B 1/00* (2006.01)
(Continued)

(52) U.S. Cl.
CPC ........... *H04B 1/006* (2013.01); *H03D 7/1425* (2013.01); *H04B 1/123* (2013.01); *H04B 1/44* (2013.01)

(58) Field of Classification Search
CPC ..... H04L 1/0054; H04L 1/05; H03H 2250/00; H03H 11/32; H04B 1/006; H03D 7/1458;
(Continued)

(56) References Cited

U.S. PATENT DOCUMENTS 8,929,945 B1   1/2015  Wei et al.
9,305,697 B2 * 4/2016  Tesson ................ H01F 17/0013
(Continued)

OTHER PUBLICATIONS

Daliri et al.,"Distortion analysis of bootstrap switch using Volterra series", IET Circuits Devices & Systems, 2009, vol. 3, Issue 6, pp. 359-364.

(Continued)

*Primary Examiner* — Khai Tran
(74) *Attorney, Agent, or Firm* — Renaissance IP Law Group LLP

(57) ABSTRACT

A band-switching network includes a dual-band balun and a switch network. The dual-band balun includes a first output and a second output. The switch network includes a first switch and a second switch in which an input to the first switch is coupled to the first output and an input to the second switch is coupled to the second balanced output. The dual-band balun further includes a primary coil, a first secondary coil and a second secondary coil in which the first secondary coil is coupled to the first balanced output and the second secondary coil is coupled to the second balanced output. In one embodiment, the primary coil and the first secondary coil are coupled by a first coupling factor $k_1$, and the primary coil and the second secondary coil are coupled by a second coupling factor $k_2$ that is different from the first coupling factor $k_1$.

15 Claims, 7 Drawing Sheets

Related U.S. Application Data

(60) Provisional application No. 63/034,962, filed on Jun. 4, 2020.

(51) Int. Cl.
  *H03D 7/14* (2006.01)
  *H04B 1/12* (2006.01)
  *H04B 1/44* (2006.01)

(58) Field of Classification Search
  CPC . H03D 7/1425; H01F 38/14; H03F 2200/216; H03F 2200/534
  USPC .................................. 373/262, 260, 267
  See application file for complete search history.

(56) References Cited

U.S. PATENT DOCUMENTS

| | | | |
|---|---|---|---|
| 10,305,517 | B1 | 5/2019 | Gathman et al. |
| 10,476,157 | B1 | 11/2019 | Segoria |
| 2011/0206088 | A1 | 8/2011 | Binder et al. |
| 2012/0256702 | A1 | 10/2012 | Khlat et al. |
| 2012/0274434 | A1* | 11/2012 | Lim ................. H01F 19/04 336/200 |
| 2017/0063404 | A1 | 3/2017 | Langer et al. |
| 2018/0198472 | A1 | 7/2018 | Lim |
| 2019/0104543 | A1 | 4/2019 | Park |
| 2019/0386629 | A1 | 12/2019 | Taniguchi |
| 2020/0028357 | A1 | 1/2020 | Chen et al. |
| 2020/0076452 | A1 | 3/2020 | Dai |
| 2021/0099140 | A1 | 4/2021 | Hassan et al. |

OTHER PUBLICATIONS

Notice of Allowance for U.S. Appl. No. 16/987,390, dated Sep. 29, 2021.

Office Action for U.S. Appl. No. 16/987,390, dated May 11, 2021.

* cited by examiner

BAND SWITCHING BALUN

CROSS-REFERENCE TO RELATED APPLICATIONS

This application is a continuation of U.S. patent application Ser. No. 16/987,390, filed on Aug. 6, 2020, which claims the priority benefit under 35 U.S.C. § 119(e) of U.S. Provisional Application No. 63/034,962, filed on Jun. 4, 2020, the disclosures of which are incorporated herein by reference in their entirety.

TECHNICAL FIELD

The subject matter disclosed herein relates to radio frequency (RF) transceivers. More particular, the subject matter disclosed herein relates to a dual-band balun in a transmit path and/or in a receive path of a transceiver.

BACKGROUND

Currently, a $5^{th}$ Generation (5G) mmWave solution has two bands, namely 28G band (24 GHz-30 GHz) (commonly referred to and referred to herein as the low-band), and 39G band (37 GHz-40 GHz) (commonly referred to and referred to herein as the high-band). Accordingly, a typical 5G chipset may operate in these two bands using two transmit (TX) chains and two receive (RX) chains in which there is one TX chain and one RX chain for each band. It would be advantageous if the two bands could be covered by a footprint of a single band instead of the footprint of two bands. One approach to provide footprint of a single 24 GHz to 40 GHz band might be a wideband solution that covers both the 28G and the 39G bands, but because a large part of the 24 GHz to 40 GHz band is not used for a 5G solution, such a wideband solution often ends up being suboptimal for the bands in question. In some cases, an additional loss (i.e., de-Q) may be added to such a wideband solution, also leading to poor performance.

SUMMARY

An example embodiment provides a band-switching network that may include a dual-band circuit and a switch network. The dual-band circuit may include a first output and a second output. The switch network may include a first switch and a second switch. An input to the first switch may be coupled to the first output and an input to the second switch may be coupled to the second output. The dual-band circuit further includes a primary coil, a first secondary coil and a second secondary coil. The first secondary coil may be coupled to the first output and the second secondary coil may be coupled to the second output. In one embodiment, the primary coil and the first secondary coil may be coupled by a first coupling factor $k_1$, and the primary coil and the second secondary coil may be coupled by a second coupling factor $k_2$ that is different from the first coupling factor $k_1$. In another embodiment, the dual-band circuit may include a dual-band balun, and a layout of the dual-band balun may include a single balun footprint.

An example embodiment provides a band-switching network that may include a dual-band circuit and a first stage of a signal-path chain. The dual-band circuit may include a first output and a second output. The first stage of the signal-path chain may include a first input and a second input. The first output may be coupled to a first input of a first stage of the signal chain, and the second output may be coupled to a second input of the first stage of the signal-path chain. In one embodiment, the dual-band circuit further includes a primary coil, a first secondary coil and a second secondary coil in which the first secondary coil may be coupled to the first output and the second secondary coil may be coupled to the second output. In one embodiment, the first secondary coil may include a first tap for a first bias input, and the second secondary coil may include a second tap for a second bias input. The first bias input may control a first signal path between the first secondary coil and the first input of the first stage of the signal-path chain and the second bias input may control a second signal path between the second secondary coil and the second input of the first stage of the signal-path chain. Another embodiment may include a switch network that includes a first switch and a second switch. An input to the first switch may be coupled to the first output and an input to the second switch may be coupled to the second output. An output of the first switch may be coupled to an output of the second switch.

An example embodiment provides a band-switching network that may include a dual-band circuit, a switch network and a first stage of a signal chain. The dual-band circuit may include a primary coil, a first secondary coil and a second secondary coil. The first secondary coil may be coupled to a first output of the dual-band circuit and the second secondary coil may be coupled to a second output of the dual-band circuit. The switch network may include a first switch and a second switch. An input to the first switch may be coupled to the first output and an input to the second switch may be coupled to the second output. An output of the first switch may be coupled to an output of the second switch. The first stage of a signal chain may include a first input and a second input. The first output may be coupled to a first input of a first stage of the signal chain, and the second output may be coupled to a second input of the first stage of the signal chain.

BRIEF DESCRIPTION OF THE DRAWING

In the following section, the aspects of the subject matter disclosed herein will be described with reference to exemplary embodiments illustrated in the figure, in which.

DETAILED DESCRIPTION

Figure 1:
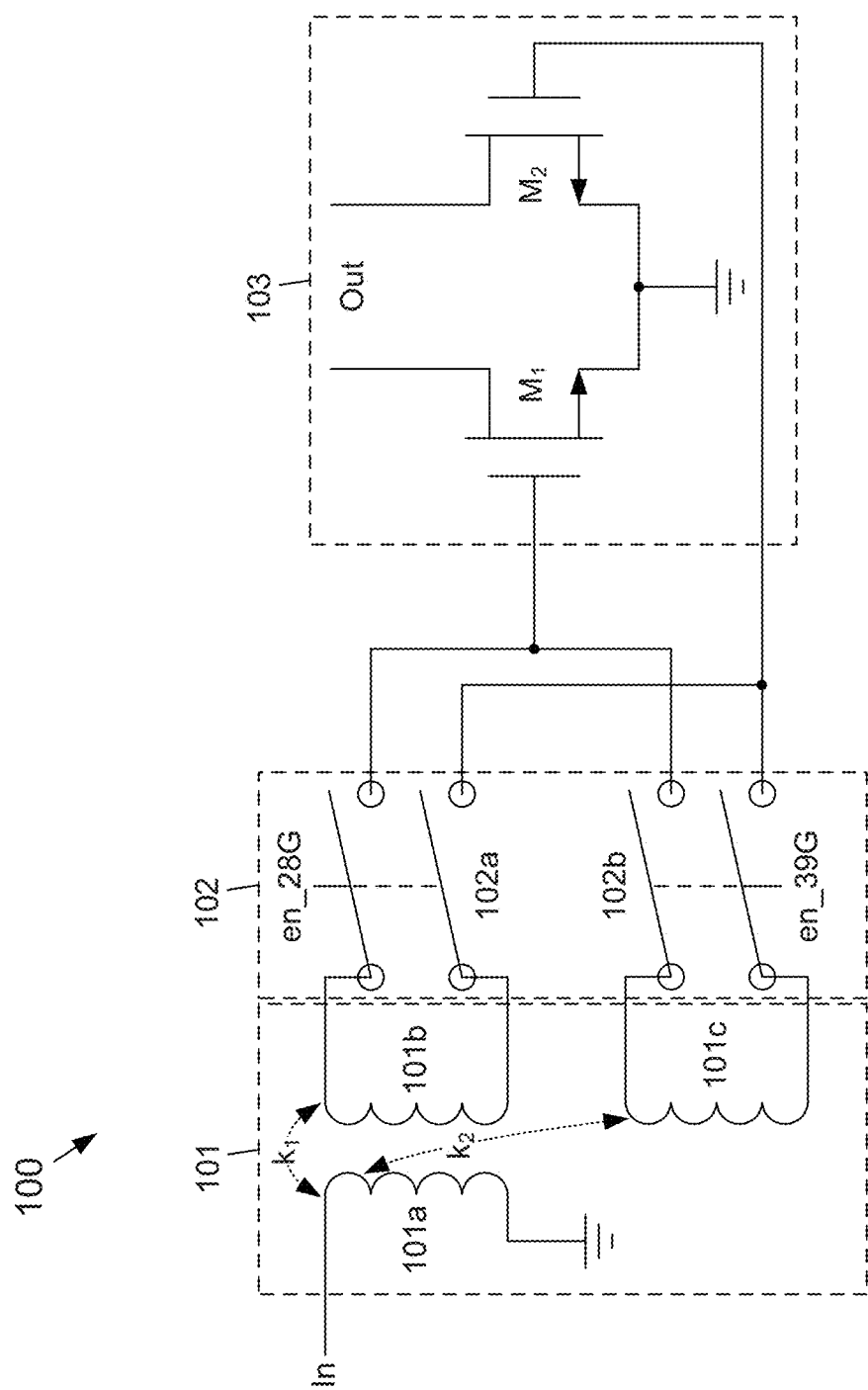
FIG. 1 shows a schematic diagram of an example embodiment of a band-switching network according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein provides a band-switching network that includes balun having a single primary winding and two secondary windings—all in a single transformer footprint—to switch between the 5G low band and the high band. As used herein, the term "balun" refers to a type of transformer that is used to convert a balanced signal to an unbalanced signal or vice versa. In one embodiment, a balun may isolate a transmission line and provide a balanced output. The reduced footprint size may provide a significant benefit in terms of area, cost of production, and competitive advantage. Additionally, the reduced footprint size, in turn, may reduce the size of the intermediate frequency (IF) portion of a transmitter chip to be half the size of a traditional IF portion of a transmitter chip. A switching technique used by the band-switching network disclosed herein ensures extremely little performance degradation over the two 5G bands in comparison to a typical approach that may use two separate transformers for the 5G two bands.

In an embodiment shown in FIG. 1, the subject matter disclosed herein provides a band-switching network that can switch between the 5G 28G and the 39G bands by switching between the secondary coils of a mixer while using the same primary coil. Interaction between the coils may be limited to the primary coil interacting with only one secondary coil at a time, which provides high continuous isolation to the other secondary coil. The secondary coil of 28G band and 39G band may include a capacitor having the same or, alternatively, different values because the switching network disclosed herein provides sufficient isolation.

The high isolation provided between the two secondary coils allows individual optimization for the bands, which leads to better performance in each of the bands. The ability to optimize the two 5G bands of operation as two separate networks provides an overall improved performance for each of the bands. In one embodiment, band-switching network disclosed herein provides a dual-band network having a high degree of flexibility to design circuitry for each of the two bands independently of each other. For example, the coupling factor, secondary inductance and the Q of the balun structure may be controlled for each band so that various combinations of coupling factors, primary inductors and secondary inductances.

A de-Q caused by the band-switching network disclosed herein may be controlled by the physical sizes of the switches and may replace the de-Q typically used for input/output matching networks for a TRX chain.

FIG. 1 shows a schematic diagram of an example embodiment of a band-switching network 100 according to the subject matter disclosed herein. The band-switching network 100 may include a dual-band balun 101 and a switch network 102. The dual-band balun 101 may include a single primary coil 101a, a first secondary coil 101b, and a second secondary coil 101c. The secondary coil 101b may be a 5G low-band (28G) secondary coil, and the secondary coil 101c may be a 5G high-band (39G) secondary coil. The primary coil 101a may be common to both the 5G 28G and 39G bands. The secondary coils 101b and 101c may be coupled by different coupling factors k to the primary coil. For example, the primary coil 101a and the secondary coil 101b may be coupled by the coupling factor $k_1$, while the primary coil 101a and the secondary coil 101c may be coupled by a different coupling factor $k_2$.

Switching between the two secondary coils may be provided by the switch network 102. The switch network 102 may include a first double pole single throw (DPST) switch 102a and a second DPST switch 102b. The two poles of an input side of the DPST switch 102a may be coupled to the output terminals of the secondary coil 101b, and the two poles of an input side of the DPST switch 102b may be coupled across the output terminals of the secondary coil 101c. The output sides of the DPST switches 102a and 102b may be coupled to a single differential input to a signal-path (TX or RX) chain 103, as shown in FIG. 1. For example, output sides of the DPST switches 102a and 102b may be coupled to an input to a mixer, which may be represented by transistors $M_1$ and $M_2$. The first and second DPST switches 102a and 102b may be respectively controlled by control signals en_28G and en_39G.

In one embodiment, the switching network 102 may prevent the two secondary coils 101b and 101c from interacting with each other (i.e., providing isolation between the two secondary coils), thereby making it possible for the two secondary coils to be optimized for their respective bands. In one embodiment, the isolation between the two secondary coils 101b and 101c enables the two coils to operate in two frequency bands that are 30-40% apart in terms of a center frequency.

Without the isolation between the two bands, the entire band-switching network 100 might act like a single entity that may not provide sufficient separation between the 28 GHz and 39 GHz bands. The switching network 102 may also de-Q the band-switching network 100, thereby providing a wide bandwidth for the 28G band, which may be useful because the impedance looking into the input of the signal-path chain 103 may be high.

Figures 2A, 2B:
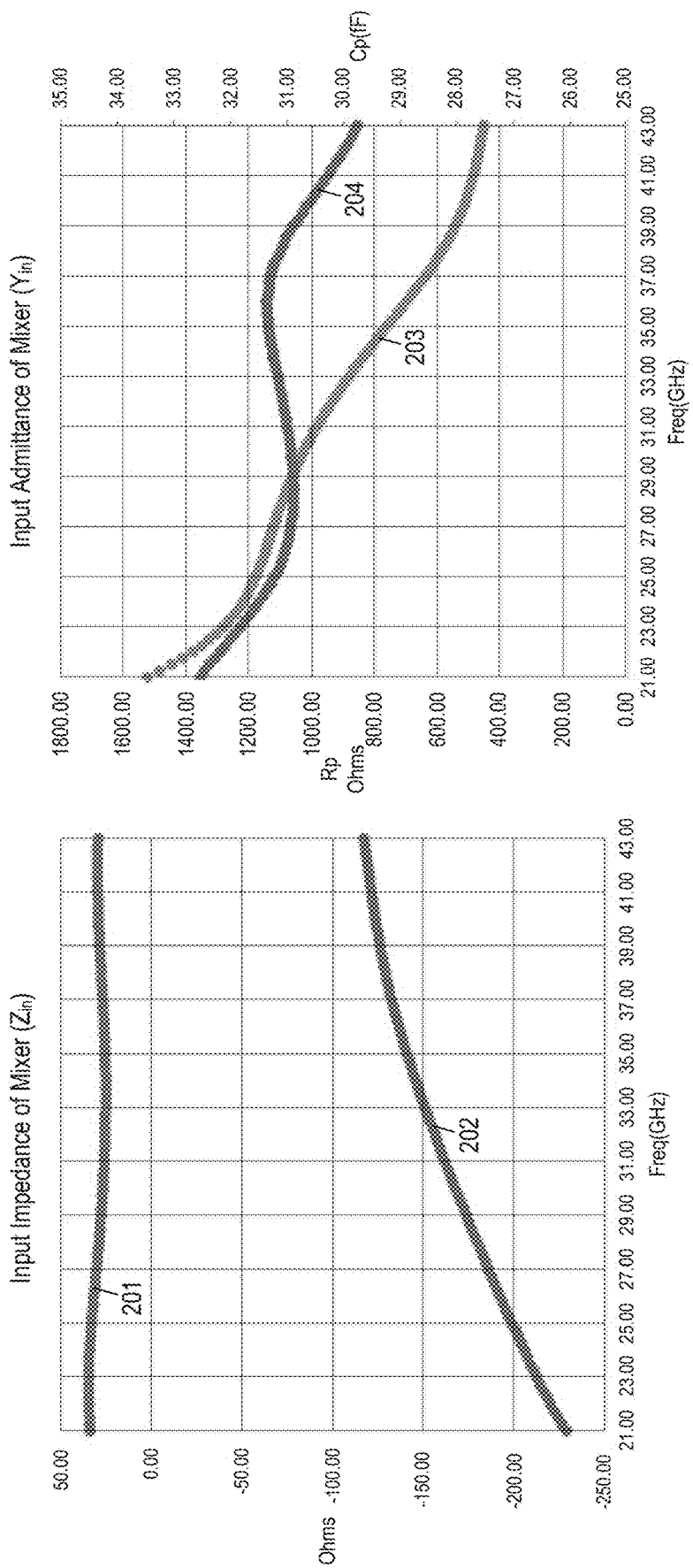
FIGS. 2A and 2B respectively are graphs of an input impedance $Z_{in}$ and an input admittance $Y_{in}$ as a function of frequency for an example mixer of a signal-path chain.

FIGS. 2A and 2B respectively are graphs of an input impedance $Z_{in}$ and an input admittance $Y_{in}$ as a function of frequency for an example mixer of a signal-path chain. More specifically, FIG. 2A is a graph of the real and imaginary parts of an input impedance $Z_{in}$ as a function of frequency for an example mixer, whereas FIG. 2B is a graph of the resistive and capacitive values of the input admittance $Y_{in}$ as a function of frequency for the example mixer. The input impedance $Z_{in}$ is to be matched to a 50 Ohm source. In FIG. 2A, the real part of the input impedance $Z_{in}$ as a function of frequency is indicated by curve 201, and the imaginary part as a function of frequency is indicated by curve 202. In FIG. 2B, the resistive value (in Ohms) of the input admittance $Y_{in}$ is indicated by curve 203, and the capacitive value (in femtofarads (fF)) is indicated by curve 204.

As can be seen from FIGS. 2A and 2B, at the input to the example mixer, the real part of the impedance looking into the gate (Rp) may be very different for the 28G band and the 39G band. This means that two different transformation ratios in the balun should be used to match the balun core to 50 Ohms. This also means that two different secondary coils may be used while using the same primary coil.

Figure 3:
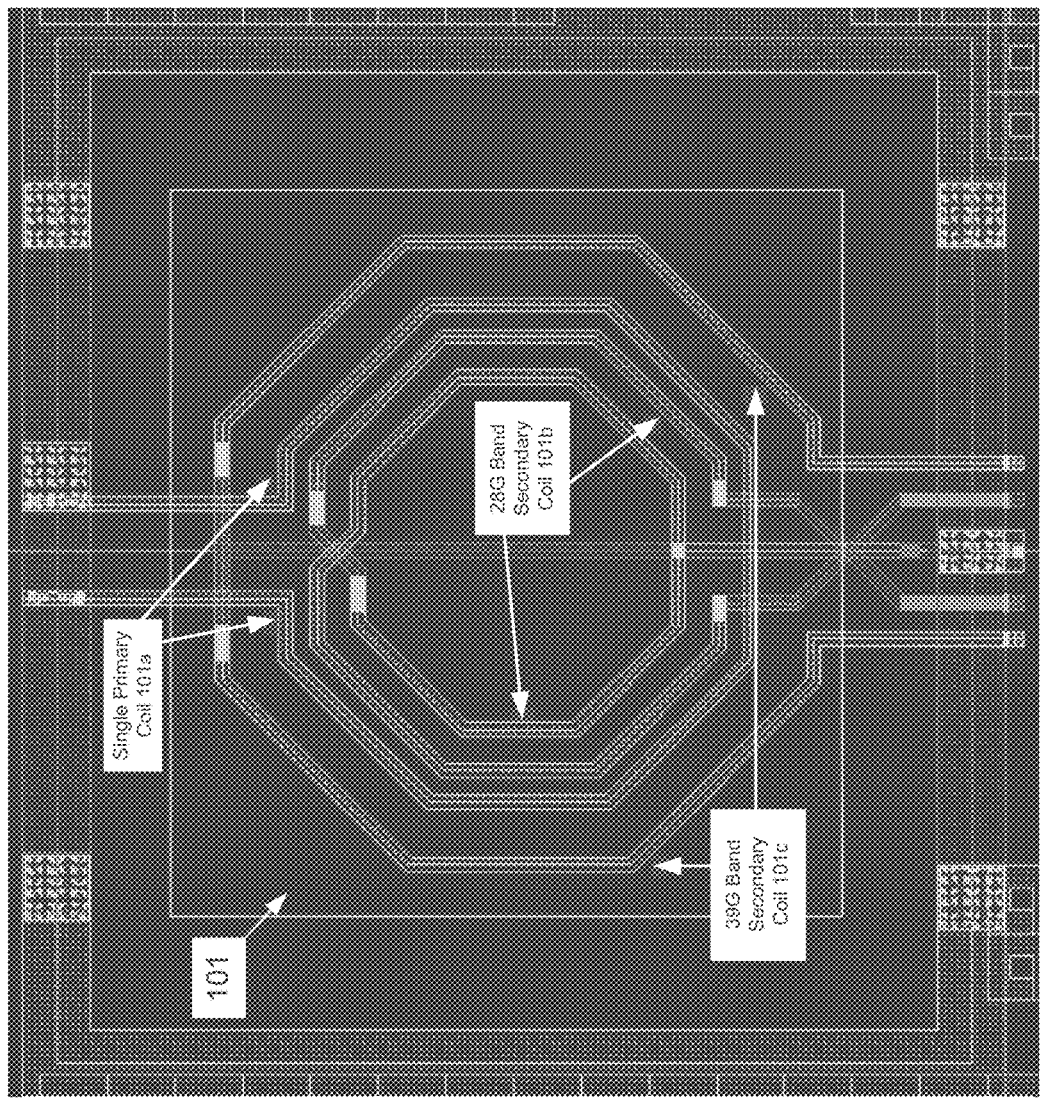
FIG. 3 shows an example layout of a dual-band balun, such as the dual-band balun of FIG. 1, according to the subject matter disclosed herein.

FIG. 3 shows an example layout 300 of a dual-band balun, such as the dual-band balun 101 of FIG. 1, according to the subject matter disclosed herein. The primary coil 101a is located between the first secondary coil 101b and the second secondary coil 101c. The layout 300 of the dual-band balun 101 is capable of operating between the two 5G bands with the assistance of switches. The inclusion of the switch network 102 into, for example, the band-switching network 100, may provide additional isolation between the two secondary coils of the balun 101. The secondary coil 101c is tightly formed into the balun network so that the dual-band balun 101 has the same footprint as a single-band balun.

Table 1 below shows some parameters associated with the dual-band balun 101. Inductance of the primary coil (L_pri) and the secondary coils (L_sec) at 28 GHz and 39 GHz are shown in picohenries (pH). The change in inductive value of the primary coil may be due to the fact that the values are measured at two different frequencies. Also included in Table 1 are the Q values for each coil (Q_pri and Q_sec). It may be seen that the Q for the coils does not significantly degrade in the passive network. The coupling factors (k) are also shown at 28 GHz and 39 GHz are shown.

TABLE 1

| Freq (GHz) | L_pri(pH) | L_sec(pH) | Q_pri | Q_sec | k |
|---|---|---|---|---|---|
| 28 GHz | 324 | 809 | 10 | 13 | 0.6 |
| 39 GHz | 444 | 387 | 6 | 13 | 0.5 |

For a switch network 102 (FIG. 1) having, for example, a 70 μm sizeNMOS (or PMOS) device, the $R_{on}$ is about 10 Ohms. The $C_{off}$ for the same example size is 17.84 fF, which is approximately −j750 Ohms. When the 28G coil is turned off, 28G coil is connected to 39G coil through approximately −j1500 Ohms, which is a large enough impedance to sufficiently isolate the two secondary coils.

Figures 4A, 4B:
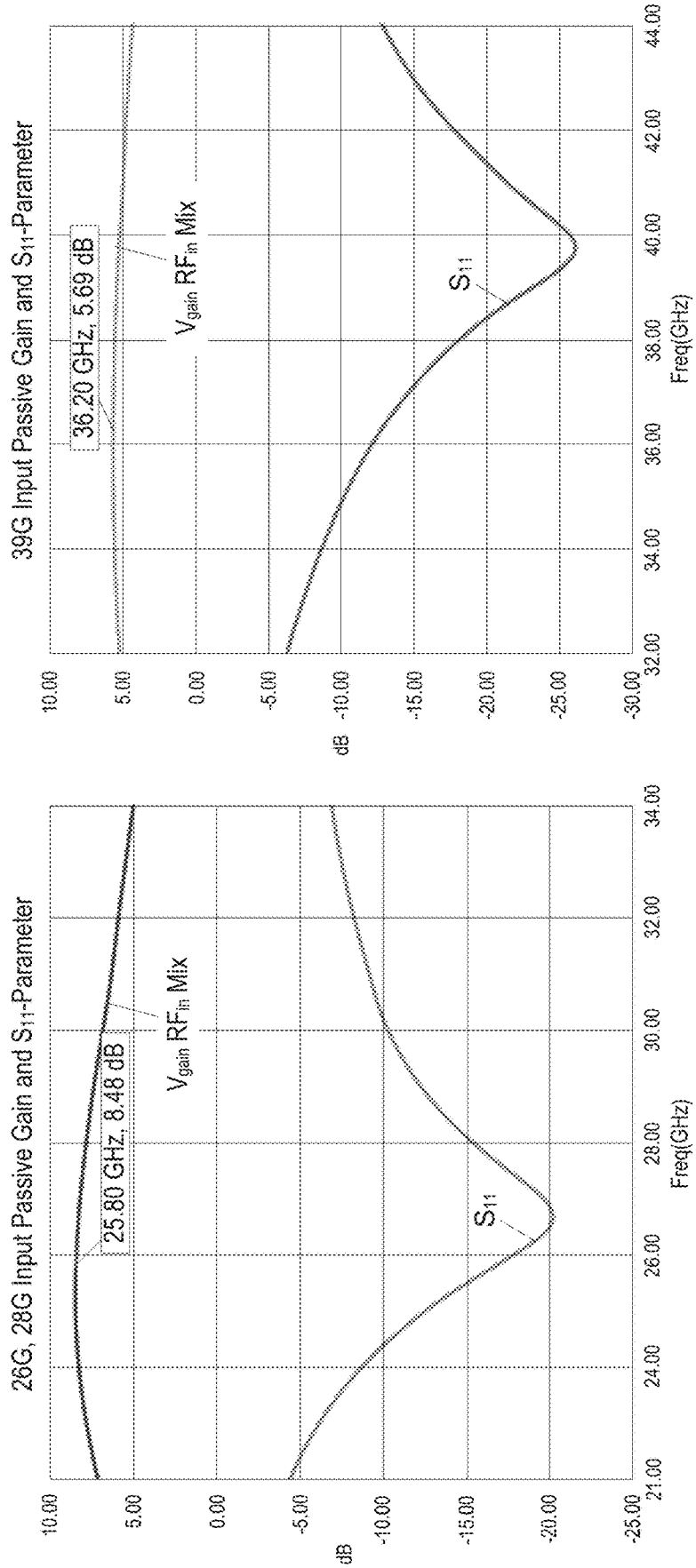
FIGS. 4A and 4B are respectively graphs of performance of the band-switching network at the 5G 28G and 39G bands in terms of $S_{11}$ and AC voltage gain ($V_{gain}$ $RF_{in}$ Mix) at the input to an TRX chain (as shown in FIG. 1) according to the subject matter disclosed herein.

FIGS. 4A and 4B are respectively graphs of performance of the band-switching network 100 at the 5G 28G and 39G bands in terms of $S_{11}$ and AC voltage gain ($V_{gain}$ $RF_{in}$ Mix) at the input to the TRX chain 103 (as shown in FIG. 1) according to the subject matter disclosed herein. FIGS. 4A and 4B show that the dual-band network provides high passive gain and matching in both of the bands. For example, at 25.80 GHz in FIG. 4A, the gain is 8.48 dB, and at 36.20 GHz, the gain is 5.69 dB. The relatively lower gain in the 39 GHz plot is based on a lower gate impedance at 39 GHz (as shown in FIG. 2B).

Figure 5:
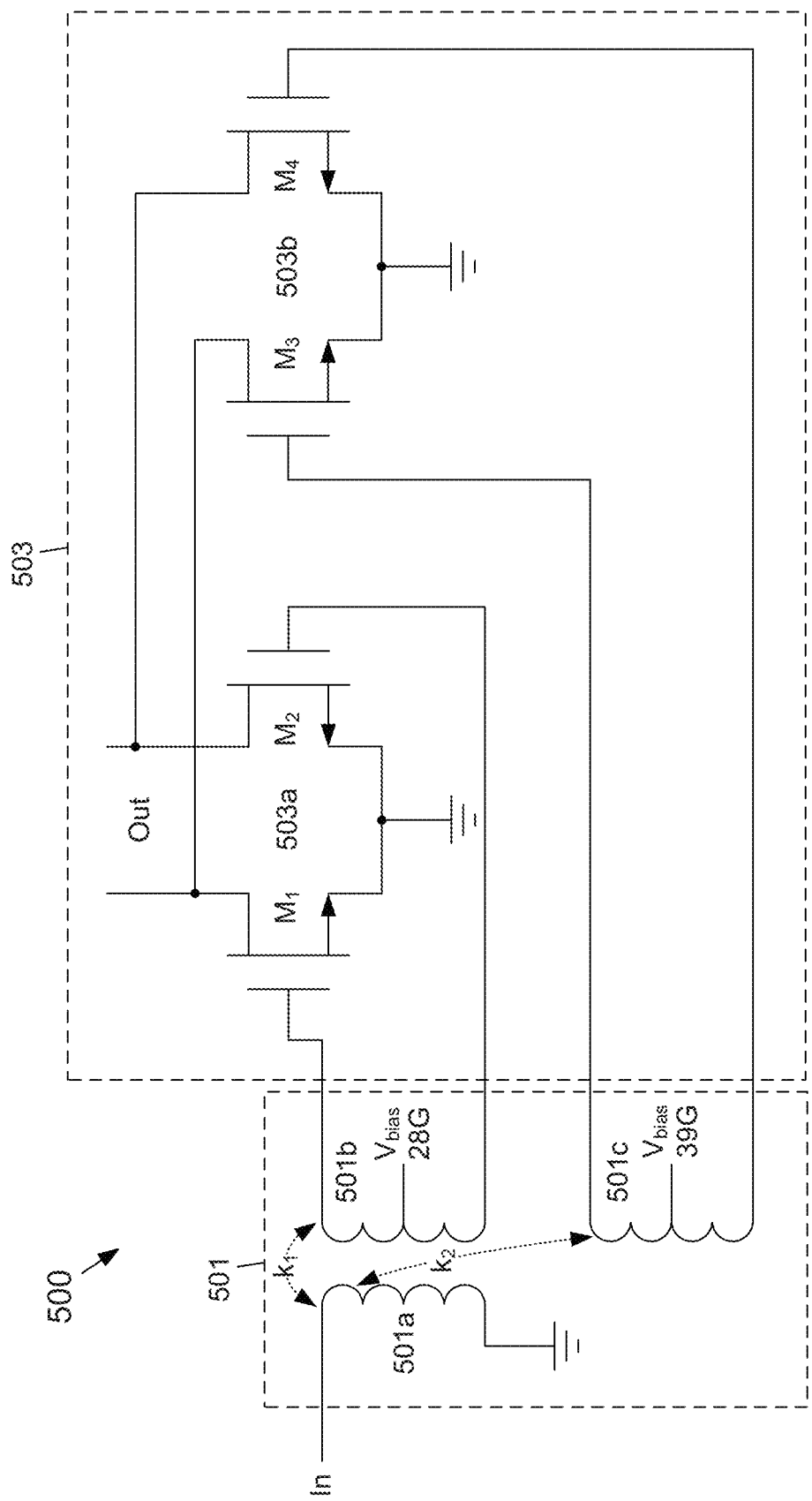
FIG. 5 shows a schematic diagram of a first alternative example embodiment of a band-switching network according to the subject matter disclosed herein.

FIG. 5 shows a schematic diagram of a first alternative example embodiment of a band-switching network 500 according to the subject matter disclosed herein. The band-switching network 500 may include a dual-band balun 501 that is coupled to the input to a TRX chain 503.

The dual-band balun 501 may include a single primary coil 501a, a first secondary coil 501b, and a second secondary coil 501c. The secondary coil 501b may be a low-band (28G) secondary coil, and the secondary coil 501c may be a high-band (39G) secondary coil. The primary coil 501a may be common to both the 5G 28G and 39G bands. The secondary coils 101b and 101c may be coupled by different coupling factors k to the primary coil. For example, the primary coil 501a and the secondary coil 501b may be coupled by the coupling factor $k_1$, while the primary coil 501a and the secondary coil 501c may be coupled by a different coupling factor $k_2$.

The first and second secondary coils 501b and 501c may include a tap through which a bias voltage ($V_{bias}$ 28G and $V_{bias}$ 39G) may be applied to control selection of the signal path that passes through the corresponding coil. As shown in FIG. 5, the outputs of first and second secondary coils 501a and 501b are respectively coupled to a first transconductance pair 503a, which includes transistors $M_1$ and $M_2$, and to a second transconductance pair 503b, which includes transistors $M_3$ and $M_4$. The outputs of the first and second transconductance amplifiers are coupled together as part of the TRX chain 503.

In one embodiment, the topology of the band-switching network 500 may not provide the same degree of band separation as the topology of the band-switching network 100 (FIG. 1), but may be useful in technologies in which the change in input impedance is highly dependent on the input bias. Another consideration associated with the topology of the band-switching network 500 is that two secondary coils 501b and 501c are eventually coupled through the gate-to-drain capacitance $C_{gd}$ of the respective transconductance pairs. The $C_{gd}$ for physically larger TRX chains may be relatively large and may provide relatively low impedance paths between the secondary coils, particularly at mmWave frequencies.

Figure 6:
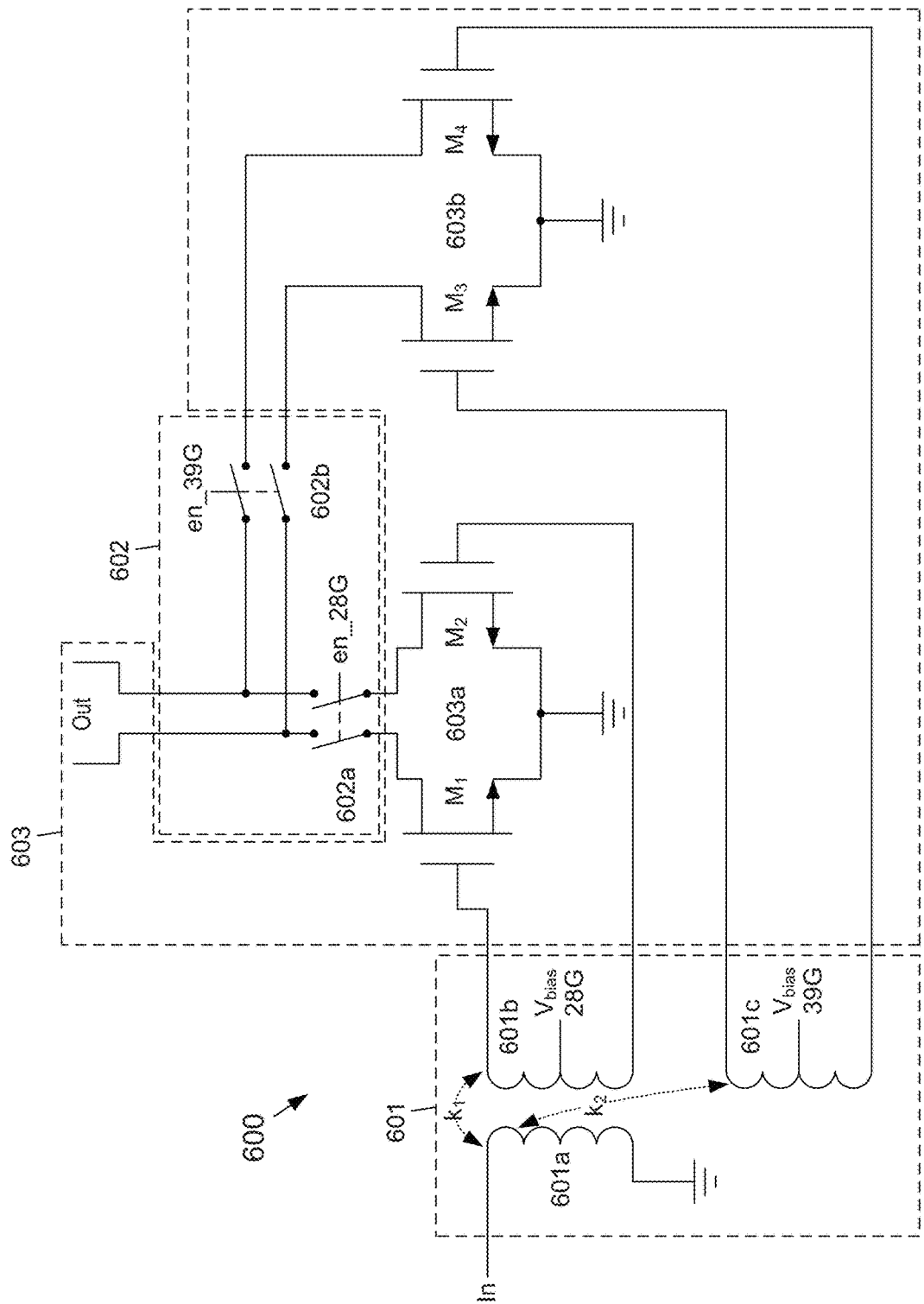
FIG. 6 shows a schematic diagram of a second alternative example embodiment of a band-switching network according to the subject matter disclosed herein.

FIG. 6 shows a schematic diagram of a second alternative example embodiment of a band-switching network 600 according to the subject matter disclosed herein. The band-switching network 600 may include a dual-band balun 601 that is coupled to the input to a TRX chain 603, represented by transconductance pairs 603a and 603b. The outputs of the transconductance pairs 603a and 603b TRX chain are coupled to a switch network 602.

The dual-band balun 601 may include a single primary coil 601a, a first secondary coil 601b, and a second secondary coil 601c. The secondary coil 601b may be a low-band (28G) secondary coil, and the secondary coil 601c may be a high-band (39G) secondary coil. The primary coil 601a may be common to both the 5G 28G and 39G bands. The secondary coils 601b and 601c may be coupled by different coupling factors k to the primary coil. For example, the primary coil 601a and the secondary coil 601b may be coupled by the coupling factor $k_1$, while the primary coil 601a and the secondary coil 601c may be coupled by a different coupling factor $k_2$.

The first and second secondary coils 601b and 601c may include a tap through which a bias voltage ($V_{bias}$ 28G and $V_{bias}$ 39G) may be applied to control selection of the signal path that passes through the coil. The outputs of first and second secondary coils 601a and 601b are respectively coupled to the first transconductance pair 603a, which includes transistors $M_1$ and $M_2$, and to a second transconductance pair 603b, which includes $M_3$ and $M_4$.

The switch network 602 may include a first double pole single throw (DPST) switch 602a and a second DPST switch 602b. The two poles of an input side of the DPST switch 602a are connected to the drain terminals of the transistors $M_1$ and $M_2$ of the transconductance pair 603a. The two poles of an input side of the DPST switch 602b are connected to the drain terminals of the transistors $M_3$ and $M_4$ of the transconductance pair 603b. The output sides of the DPST switches 602a and 602b are connected are connected together, as shown in FIG. 6. The first and second DPST switches 602a and 602b are respectively controlled by control signals en_28G and en_39G. The isolation in the drain-combining structure within the TRX chain 603 may be improved by the switch network 602 in comparison to the isolation in the drain-combining structure with the TRX chain 503 in FIG. 5.

Figure 7:
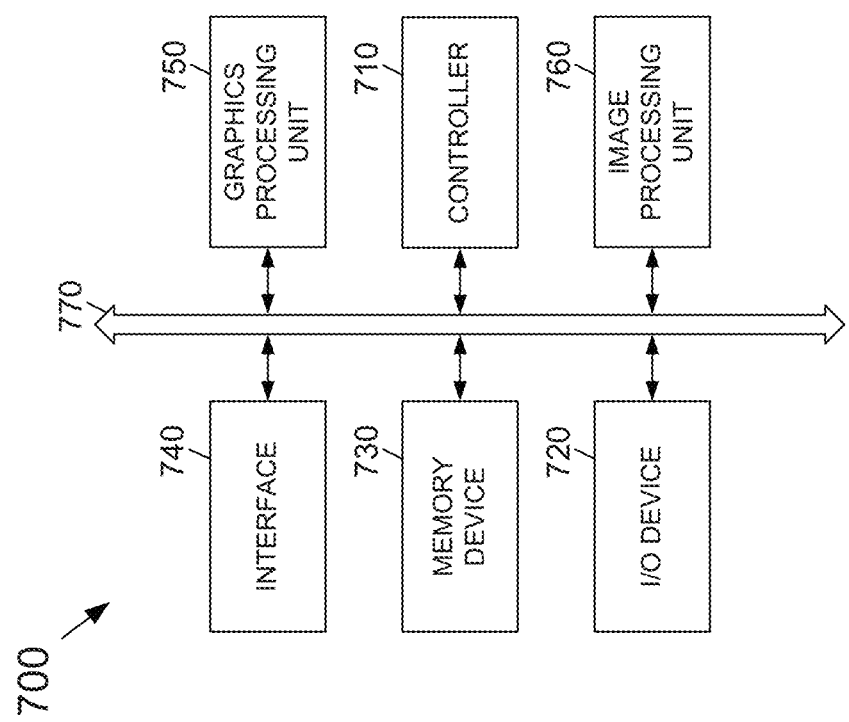
FIG. 7 depicts an electronic device that includes a band-switching network that includes a dual-band balun in a transmit path and/or a receive path of a transceiver according to the subject matter disclosed herein.

FIG. 7 depicts an electronic device 700 that includes a band-switching network that includes a dual-band balun in a transmit path and/or a receive path of a transceiver according to the subject matter disclosed herein. Electronic device 700 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 700 may also be part of, but not limited to, an ADAS, a mobile-device imaging system, an industrial imaging system, robotics, etc. The electronic device 700 may include a controller 710, an input/output device 720 such as, but not limited to, a keypad, a keyboard, a display, a touch-screen display, a camera, and/or an image sensor, a memory 730, an interface 740, a GPU 750, and an imaging processing unit 760 that are coupled to each other through a bus 770. The controller 710 may include, for example, at least one microprocessor, at least one digital signal processor, at least one microcontroller, or the like. The memory 730 may be configured to store a command code to be used by the controller 710 or a user data.

Electronic device 700 and the various system components of electronic device 700 may include the image processing unit 760. The interface 740 may be configured to include a wireless interface that is configured to transmit data to or receive data from a wireless communication network using a RF signal. The wireless interface 740 may include, for example, an antenna, a wireless transceiver and so on. In one embodiment, the interface 740 may include a band-switching network that includes a dual-band balun in a transmit path and/or a receive path of a transceiver according to the subject matter disclosed herein. The electronic system 700 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of, data-processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A band-switching network, comprising:
   a dual-band circuit comprising a first output and a second output, a primary coil, a first secondary coil coupled to the first output and a second secondary coil coupled to the second output, a layout of first secondary coil is located within a layout of the primary coil, and wherein the layout of the primary coil is located within a layout of the second secondary coil; and
   a switch network comprising a first switch and a second switch, an input to the first switch being coupled to the first output and an input to the second switch being coupled to the second output.

2. The band-switching network of claim 1, wherein the dual-band circuit comprises a dual-band balun, and
   wherein a layout of the dual-band balun comprises a single balun footprint.

3. The band-switching network of claim 1, wherein a frequency band of the first output comprises a Fifth Generation (5G) 28G band, and a frequency band of the second output comprises a 5G 39G band.

4. The band-switching network of claim 3, wherein an output of the first switch is coupled to an output of the second switch.

5. The band-switching network of claim 1, wherein the first output is coupled to a first input of a signal-path chain, and a first output of the signal-path chain is coupled to the input to the first switch, and
   wherein the second output is coupled to a second input of the signal-path chain, and a second output of the signal-path chain is coupled to the input of the second switch.

6. The band-switching network of claim 5, wherein the first secondary coil includes a first tap for a first bias input, and the second secondary coil includes a second tap for a second bias input, the first bias input controlling a first signal path between the first secondary coil and the first input of the signal-path chain and the second bias input controlling a second signal path between the second secondary coil and the second input of the signal-path chain.

7. A band-switching network, comprising:
   a dual-band circuit comprising a first output and a second output, a primary coil, a first secondary coil coupled to the first output and a second secondary coil coupled to the second output, a layout of first secondary coil is located within a layout of the primary coil, and wherein the layout of the primary coil is located within a layout of the second secondary coil; and a signal-path chain comprising a first input and a second input, the first output being coupled to the first input of the signal-path chain, and the second output being coupled to the second input of the signal-path chain.

8. The band-switching network of claim 7, wherein the dual-band circuit comprises a dual-band balun, and
wherein a layout of the dual-band balun comprises a single balun footprint.

9. The band-switching network of claim 8, wherein a frequency band of the first output comprises a Fifth Generation (5G) 28G band, and a frequency band of the second output comprises a 5G 39G band.

10. The band-switching network of claim 7, wherein the first secondary coil includes a first tap for a first bias input, and the second secondary coil includes a second tap for a second bias input, the first bias input controlling a first signal path between the first secondary coil and the first input of the signal-path chain and the second bias input controlling a second signal path between the second secondary coil and the second input of the signal-path chain.

11. The band-switching network of claim 10, further comprising a switch network comprising a first switch and a second switch, an input to the first switch being coupled to the first output and an input to the second switch being coupled to the second output, an output of the first switch being coupled to an output of the second switch.

12. A band-switching network, comprising:
a dual-band circuit comprising a primary coil, a first secondary coil and a second secondary coil, the first secondary coil being coupled to a first output of the dual-band circuit and the second secondary coil being coupled to a second output of the dual-band circuit, a layout of first secondary coil is located within a layout of the primary coil, and wherein the layout of the primary coil is located within a layout of the second secondary coil;

a switch network comprising a first switch and a second switch, an input to the first switch being coupled to the first output and an input to the second switch being coupled to the second output, an output of the first switch being coupled to an output of the second switch; and a signal chain comprising a first input and a second input, the first output being coupled to the first input of the signal chain, and the second output being coupled to the second input of the signal chain.

13. The band-switching network of claim 12, wherein the dual-band circuit comprises a dual-band balun, and
wherein a layout of the dual-band balun comprises a single balun footprint.

14. The band-switching network of claim 13, wherein a frequency band of the first output comprises a Fifth Generation (5G) 28G band, and a frequency band of the second output comprises a 5G 39G band.

15. The band-switching network of claim 14, wherein the first secondary coil includes a first tap for a first bias input, and the second secondary coil includes a second tap for a second bias input, the first bias input controlling a first signal path between the first secondary coil and the first input of the signal chain and the second bias input controlling a second signal path between the second secondary coil and the second input of the signal chain.

* * * * *